(12) United States Patent
Tseng et al.

(10) Patent No.: US 10,861,841 B2
(45) Date of Patent: Dec. 8, 2020

(54) SEMICONDUCTOR DEVICE WITH MULTIPLE POLARITY GROUPS

(71) Applicant: Taiwan Semiconductor Manufacturing Company, Ltd.

(72) Inventors: Ying-Cheng Tseng, Tainan (TW); Yu-Chih Huang, Hsinchu (TW); Chih-Hsuan Tai, Taipei (TW); Ting-Ting Kuo, Hsinchu (TW); Chi-Hui Lai, Taichung (TW); Ban-Li Wu, Hsinchu (TW); Chiahung Liu, Hsinchu (TW); Hao-Yi Tsai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/215,325

(22) Filed: Dec. 10, 2018

(65) Prior Publication Data

US 2020/0105738 A1 Apr. 2, 2020

Related U.S. Application Data

(60) Provisional application No. 62/738,618, filed on Sep. 28, 2018.

(51) Int. Cl.
*H01L 27/01* (2006.01)
*H01L 23/528* (2006.01)
(Continued)

(52) U.S. Cl.
CPC .......... *H01L 27/013* (2013.01); *H01L 21/705* (2013.01); *H01L 21/76816* (2013.01);
(Continued)

(58) Field of Classification Search
CPC ..... H01L 23/5226; H01L 28/10; H01L 28/20; H01L 28/40; H01L 24/14;
(Continued)

(56) References Cited

U.S. PATENT DOCUMENTS 6,917,510 B1 7/2005 Prymak
8,361,842 B2 1/2013 Yu et al.
(Continued)

FOREIGN PATENT DOCUMENTS

DE 102015113185 A1 2/2017
KR 20140143678 A 12/2014
(Continued)

*Primary Examiner* — Hsien Ming Lee
(74) *Attorney, Agent, or Firm* — Slater Matsil, LLP

(57) ABSTRACT

A semiconductor device includes passive electrical components in a substrate; and an interconnect structure over the passive electrical components, conductive features of the interconnect structure being electrically coupled to the passive electrical components. The conductive features of the interconnect structure includes a first conductive line over the substrate; a conductive bump over the first conductive line, where in a plan view, the conductive bumps has a first elongated shape and is entirely disposed within boundaries of the first conductive line; and a first via between the first conductive line and the conductive bump, the first via electrically connected to the first conductive line and the conductive bump, where in the plan view, the first via has a second elongated shape and is entirely disposed within boundaries of the conductive bump.

20 Claims, 10 Drawing Sheets

(51) Int. Cl.
*H01L 23/00* (2006.01)
*H01L 49/02* (2006.01)
*H01L 21/768* (2006.01)
*H01L 21/70* (2006.01)
*H01L 23/522* (2006.01)
*H01L 25/10* (2006.01)

(52) U.S. Cl.
CPC .... *H01L 21/76877* (2013.01); *H01L 23/5226* (2013.01); *H01L 23/5283* (2013.01); *H01L 23/5286* (2013.01); *H01L 24/13* (2013.01); *H01L 28/10* (2013.01); *H01L 28/20* (2013.01); *H01L 28/40* (2013.01); *H01L 25/105* (2013.01); *H01L 2224/13025* (2013.01); *H01L 2225/1035* (2013.01); *H01L 2225/1058* (2013.01)

(58) Field of Classification Search
CPC ... H01L 2224/13025; H01L 2225/1035; H01L 2225/1058; H01L 21/76816; H01L 21/76877
See application file for complete search history.

(56) References Cited

U.S. PATENT DOCUMENTS

| | | | |
|---|---|---|---|
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 8,993,380 B2 | 3/2015 | Hou et al. | |
| 9,281,254 B2 | 3/2016 | Yu et al. | |
| 9,293,401 B2 | 3/2016 | Yoon et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 10,128,179 B2 | 11/2018 | Kim et al. | |
| 2011/0291288 A1 | 12/2011 | Wu et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2014/0363927 A1 | 12/2014 | Hurwitz et al. | |
| 2016/0064309 A1 | 3/2016 | Su et al. | |
| 2017/0188458 A1 | 6/2017 | Hsieh et al. | |
| 2018/0122580 A1 | 5/2018 | Park et al. | |
| 2019/0157108 A1* | 5/2019 | Liao | H01L 21/4857 |
| 2020/0075563 A1 | 3/2020 | Hsieh et al. | |

FOREIGN PATENT DOCUMENTS

| | | |
|---|---|---|
| KR | 20180046825 A | 5/2018 |
| TW | 201804573 A | 2/2018 |
| TW | 201810576 A | 3/2018 |
| TW | 201830612 A | 8/2018 |

\* cited by examiner

SEMICONDUCTOR DEVICE WITH MULTIPLE POLARITY GROUPS

PRIORITY CLAIM AND CROSS-REFERENCE

This application claims priority to U.S. Provisional Application No. 62/738,618, filed on Sep. 28, 2018, entitled "Semiconductor Device with Multiple Polarity Groups," and is related to the following co-pending and commonly assigned U.S. patent application Ser. No. 16/215,373, filed on Dec. 10, 2018, and entitled "Semiconductor Devices and Methods of Forming the Same," which applications are hereby incorporated by references in their entireties.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

An example of these packaging technologies is the integrated fan-out (InFO) package technology. In an InFO package, a die is embedded in a molding material. A redistribution structure is formed on a first side of the die and is electrically coupled to the die. The redistribution structure extends beyond lateral extents of the die. Electrically conductive features of the redistribution structure, such as conductive lines or conductive pads, allow electrically connection to the die at locations beyond the boundaries of the die.

Integrated passive devices (IPDs) and technologies are gaining popularity recently. A wide variety of passive devices, such as capacitors, resistors, inductors, baluns, couplers, splitters, filters, or diplexers can be integrated in an IPD. Due to the high level of integration, IDPs may achieve significant reduction in footprint compared with, e.g., surface mount devices (SMDs). At the same time, IPDs may provide significant cost reductions and performance improvements over SMDs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the description herein, unless otherwise stated, like reference numbers refer to like elements.

In an embodiment, an integrated passive device (IPD) includes passive electrical components (e.g., capacitors) formed in a substrate of the IPD, and an interconnect structure over and electrically coupled to the passive electrical components. The interconnect structure comprises conductive lines, vias, and conductive bumps. In some embodiments, the conductive bumps of the IPD includes three or more polarity groups, where each polarity group includes conductive bumps configured to be coupled to a same polarity (e.g., a supply voltage such as +5V, or a reference voltage such as the electrical ground) of a power supply. By having three or more polarity groups, the equivalent series inductance (ESL) of the IPD is reduced. In some embodiments, vias in a topmost via layer of the interconnect structure are connected to the conductive bumps, and an area (e.g., cross-section area) of the vias is between about 50% and about 90% of an area (e.g., cross-section area) of the conductive bumps. By having large vias in the topmost via layer, the equivalent series resistance (ESR) of the IPD is reduced.

Figure 1A:
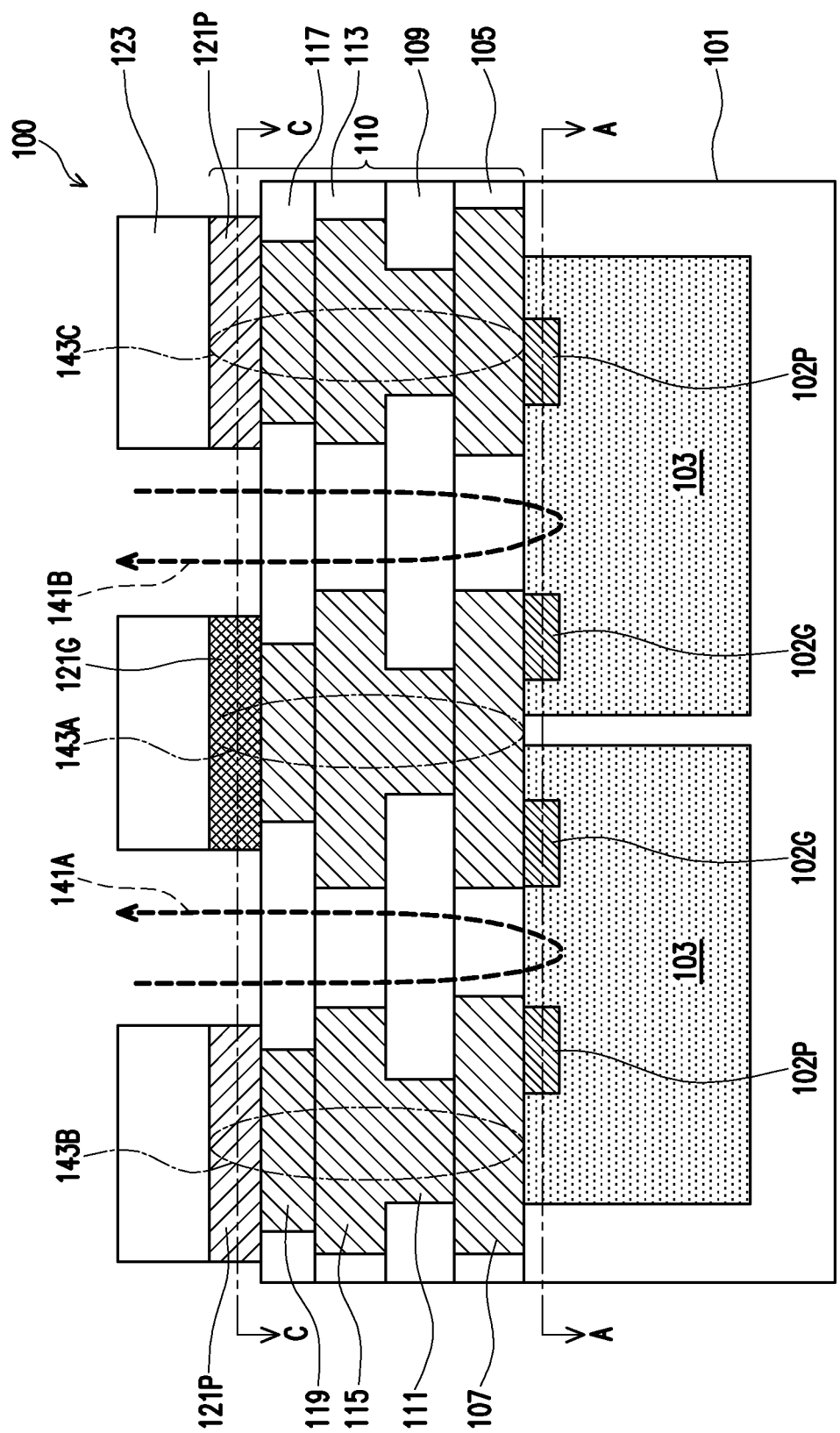
FIGS. 1A-1D illustrates various views of a portion of a semiconductor device, in accordance with an embodiment.
Figure 1B:
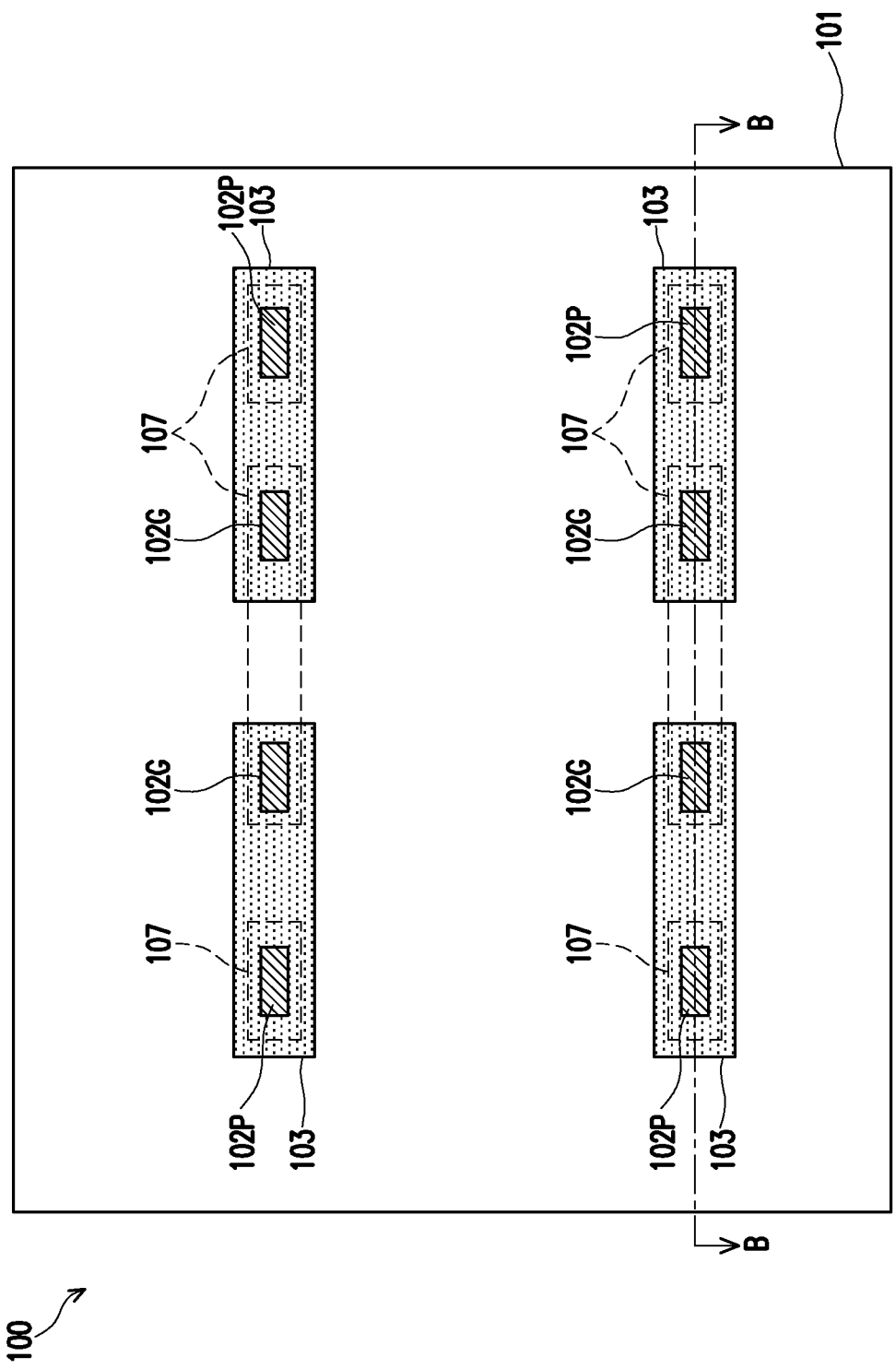
Figure 1C:
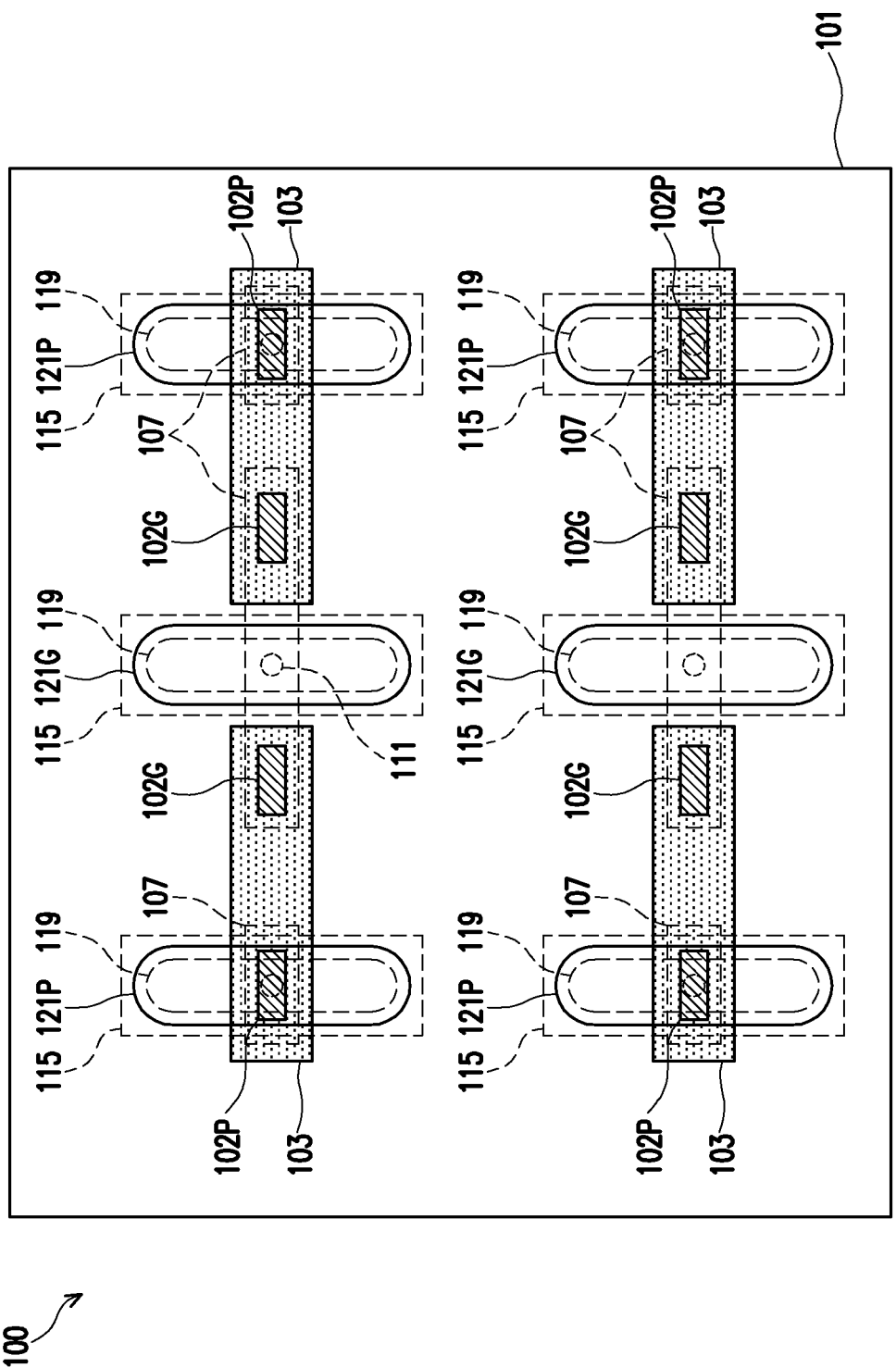
Figure 1D:
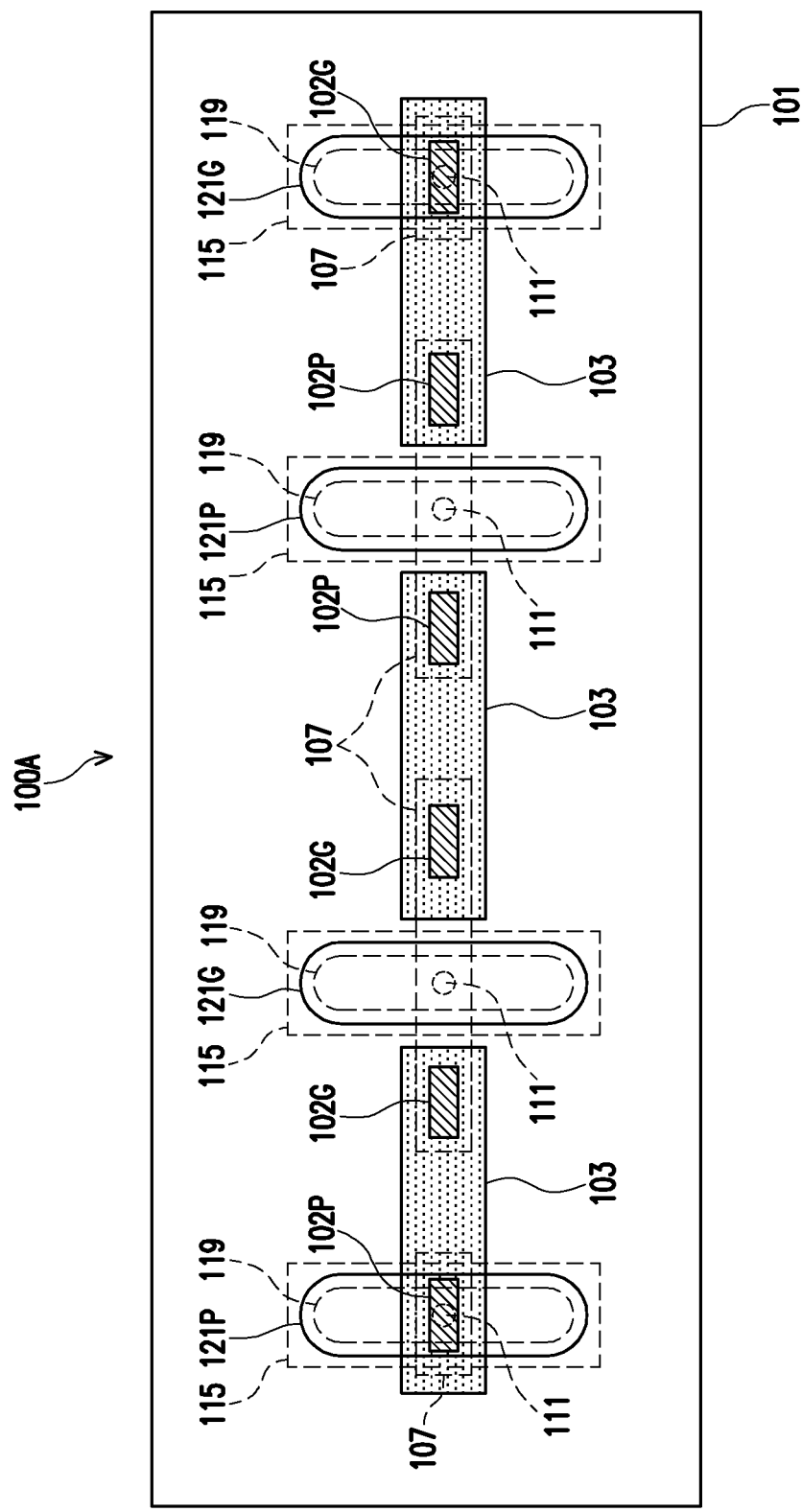

FIGS. 1A-1D illustrate various views (e.g., cross-section view and plan view) of a portion of a semiconductor device 100, in accordance with some embodiments. In particular, FIG. 1A illustrates a cross-sectional view of the semiconductor device 100 along cross-section B-B in FIG. 1B, and FIG. 1B illustrates a plan view of the semiconductor device 100 along cross-section A-A in FIG. 1A. FIG. 1C illustrates a plan view of the semiconductor device 100 along cross-section C-C in FIG. 1A, in an embodiment. FIG. 1D illustrates a plan view of the semiconductor device 100 along cross-section C-C in FIG. 1A, in another embodiment. Note that since FIGS. 1A-1D illustrate a portion of the semiconductor device 100, the semiconductor device 100 may have additional elements (e.g., 103, 121) disposed in areas beyond the illustrated portion.

The semiconductor device 100 may be an integrated passive device (IPD) with an array of electrical components 103, such as capacitors, integrated in the semiconductor device 100. Therefore, the semiconductor device 100 may also be referred to as an IPD. The discussion hereinafter uses capacitors as examples of the passive electrical components (e.g., 103) integrated in the semiconductor device 100. The principle of the present disclosure may also be applied to IPDs with other types of passive electrical components, such as resistors, inductors, and the like.

As illustrated in FIG. 1A, the semiconductor device 100 includes electrical components 103 formed in/on a substrate 101. An interconnect structure 110, which includes electrically conductive features such as conductive lines (e.g., 107, 115) and vias (e.g., 111, 119) formed in a plurality of dielectric layers (e.g., 105, 109, 113, and 117), is formed over the electrical components 103 and over the substrate 101. The interconnect structure 110 also includes conductive bumps 121 (e.g., 121P/121G). The interconnect structure 110 is electrically coupled to the electrical components 103. As illustrated in FIG. 1A, the conductive bumps 121 (e.g., 121P, 121G) are formed over and electrically coupled to a topmost layer of vias 119 of the interconnect structure 110. Solder regions 123, which may be optional, are formed over the conductive bumps 121.

The substrate 101 may be formed of a semiconductor material such as silicon, doped or undoped, or an active layer of a semiconductor-on-insulator (SOI) substrate. The substrate 101 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In FIG. 1A, electrical components 103, such as passive electrical components, are formed in or on the substrate 101 using suitable fabrication techniques. In the illustrated embodiments, the electrical components 103 are capacitors, and each of the capacitors has two contact pads 102 (e.g., 102G, 102P) serving as the two terminals of the capacitor. Each of the electrical components 103 may comprise a substrate and one or more dielectric layers over the substrate. The contact pads 102 represent contacts for electrical connection to the electrical component 103. The contact pad 102 may comprise aluminum, but other materials, such as copper, may alternatively be used. The contact pads 102 of each electrical component 103 (e.g., capacitors) are configured to be electrically coupled to two different polarities of a power supply. For example, the contact pads 102P may be configured to be coupled to a supply voltage, such as +5V or +3V, and the contact pad 102G may be configured to be coupled to a reference voltage, such as the electrical ground. Throughout the discussion herein, the letter "P" after a numeral (e.g., 102P) is used to indicate that a conductive features (e.g., 102P) is configured to be coupled to a supply voltage (e.g., +5V, +3V), and the letter "G" after a numeral (e.g., 102G) is used to indicate that a conductive feature (e.g., 102G) is configured to be coupled to a reference voltage (e.g., the electrical ground).

In the example of FIG. 1A, the interconnect structure 110 includes a plurality of metallization layers, such as layers of conductive lines (e.g., 107, 115) and layers of vias (e.g., 111, 119), formed in the plurality of dielectric layers (e.g., 105, 109, 113, and 117). The interconnect structure also includes the conductive bumps 121 (e.g., 121P/121G). In FIG. 1A, the interconnect structure 110 includes alternating layers of conductive lines and vias, with the bottommost metallization layer being a layer of conductive lines 107. In some embodiments, the conductive bumps 121 and the vias 119 are formed in a same processing step, in which case the topmost metallization layer of the interconnect structure 110 may include the conductive bumps 121 and the vias 119. Throughout the discussion herein, the vias 119 may be referred to as the topmost layer of vias of the interconnect structure 110. The structure of the interconnect structure 110 (e.g., number and location of the metallization layers in the interconnect structure 110) shown in FIG. 1A is merely an example and not limiting. Other structures are also possible and are fully intended to be included within the scope of the present disclosure.

Still referring to FIG. 1A, the dielectric layers 105, 109, 113, and 117 of the interconnect structure 110 may be formed of a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; or a combination thereof, and may be formed, for example, by spin coating, lamination, chemical vapor deposition (CVD), or the like. The conductive features of the interconnect structure, such as the conductive lines 107/115 and the vias 111/119, may be formed through any suitable process, such as deposition, damascene, dual damascene, or the like.

FIG. 1B illustrates a plan view of a portion of the semiconductor device 100 of FIG. 1A along the cross-section A-A, in an embodiment. As illustrated in FIG. 1B, an array of electrical components 103 are formed in/on the substrate 101, and each of the electrical components 103 has a contact pad 102P and a contact pad 102G. FIG. 1B further illustrates the conductive lines 107 in the bottommost layer of the interconnect structure 110, which is not in the cross-section A-A and is illustrated in phantom. As illustrated in FIG. 1B, each of the contact pads 102 is electrically coupled to a conductive line 107, and the contact pad 102G (e.g., connecting to the electrical ground) of two neighboring electrical components 103 are coupled together by a conductive line 107. The shape and the size of the array of electrical components 103, as well as the electrical connections illustrated in FIG. 1B are merely non-limiting examples. Other shapes, sizes, and electrical connections are also possible and are fully intended to be included within the scope of the present disclosure. For example, the electrical components 103 of the semiconductor device 100 may be formed in a row (e.g., aligned along a line), as illustrated in FIG. 1D.

Referring back to FIG. 1A, the conductive bumps 121 (e.g., 121P, 121G) are formed over and electrically coupled to the vias 119 of the interconnect structure 110. The conductive bumps 121 serve as the under-bump metallurgy (UBM) structures of the semiconductor device 100, and therefore, may also be referred to as the UBM structures of the semiconductor device 100. Any suitable method for forming the conductive bumps 121 may be used. The conductive bumps 121P and 121G are configured to be coupled to two different polarities of a power supply. For example, the conductive bump 121P may be configured to be coupled to a supply voltage, e.g., +5V or +3V, and the conductive bump 121G may be configured to be coupled to a reference voltage, such as the electrical ground.

In an exemplary embodiment, the conductive bumps 121 and the vias 119 are formed in a same processing step. For example, after the dielectric layer 117 is formed, a plurality of first openings are formed in the dielectric layer 117 to expose the underlying conductive lines 115. The locations of the first openings correspond to locations of the vias 119 to be formed subsequently. Next, a seed layer is formed over the dielectric layer 117 and along the interior of the first opening in the dielectric layer 117. Next, a patterned mask layer (e.g., photoresist) is formed over the seed layer, and conductive material(s), such as copper, is formed (e.g., by plating) in the openings of the patterned mask layer and over the seed layer. Next, the mask layer is removed, and portions of the seed layer on which the conductive material(s) is not formed is also removed.

In the illustrated embodiment, the interconnect structure 110 comprises a plurality of electrically parallel conductive paths 143 (e.g., 143A, 143B, 143C), each of which includes conductive features (e.g., conductive lines and vias) electrically coupled between a conductive bump 121 and at least one contact pad 102 of the electrical component 103. In the example of FIG. 1A, conductive lines (e.g., 115 and 107) and vias (e.g., 119 and 111) under the conductive bump 121G form a first conductive path 143A between the conductive bump 121G and the contact pad 102G. In the example of FIG. 1A, the first conductive path 143A is coupled to the contact pads 102G of the two adjacent electrical components 103. Similarly, two additional conductive paths 143B and 143C are formed by conductive lines (e.g., 115 and 107) and vias (e.g., 119 and 111) coupled between the conductive bumps 121P and the respective contact pads 102P.

In some embodiments, there is no electrically conductive feature (e.g., conductive lines or vias) in the interconnect structure 110 connecting the different conductive paths 143 of the interconnect structure 110. In other words, the conductive paths 143 of the interconnect structures 110 do not cross (e.g., do not physically intersect) with each other, thus the conductive paths 143 are referred to as electrically parallel conductive paths. As a result, an electrical current (e.g., a positive electrical current, see current path 141A or 141B in FIG. 1A) flowing in the semiconductor device 100, after leaving the conductive bumps 121P, can return to the conductive bump 121G only after traveling through the electrical component 103. For example, referring to the current path 141A in FIG. 1A, an electrical current travels from the conductive bump 121P down, through the conductive path 143B toward the contact pad 102P, through the electrical component 103, travels upward from the contact pad 102G, through the conductive path 143A, and returns at the conductive bump 121G.

In the illustrated embodiment, the array of electrical components 103 are capacitors connected in parallel. As will be discussed in more details hereinafter, the contact pads 102P are electrically coupled to the supply voltage through the conductive bumps 121P, and the contact pads 102G are electrically coupled to the electrical grounds through the conductive bumps 121G. One skilled in the art will appreciate that the equivalent capacitance of N parallel connected capacitors, each having a capacitance of C, is N×C. Therefore, by parallel connecting the plurality of capacitors, the semiconductor device 100 is able to provide a much larger equivalent capacitance (e.g., 0.001 µF to 100 µF) to an external circuit or an external device.

As the size of semiconductor device continues to shrink in advanced processing techniques and as the speed (e.g., clock speed) of semiconductor device continues to increase, parasitic characteristics of the semiconductor device may cause non-negligible impact on the performance of the semiconductor device, and therefore, should be taken into consideration during design and manufacturing of the semiconductor device. For example, for an IPD with integrated capacitors, the equivalent series inductance (ESL) of the IPD device may limit (e.g., lower) the operating frequency of the IPD, because when operating at frequencies higher than the resonant frequency, the IPD may behave as an inductor instead of a capacitor, due to the ESL. In addition, the equivalent series resistance (ESR) of the IPD may lower efficiencies of the IPD by consuming power. Various embodiment designs disclosed herein advantageously reduces the ESL and ESR of the semiconductor devices, thus improving the performance of the semiconductor devices.

FIG. 1C illustrates a plan view of the semiconductor device 100 along cross-section C-C in FIG. 1A, in an embodiment. For simplicity, not all features of the semiconductor device 100 are illustrated in FIG. 1C. In addition, to illustrate the relative location of various features, some features that are not in the cross-section C-C (e.g., 119, 115, 111, and 107) are illustrated in phantom.

In FIG. 1C, each of the conductive bumps 121 (e.g., 121P, 121G) is electrically coupled to a respective conductive line 115 through a respective via 119, and each of the conductive line 115 is electrically coupled to a respective conductive line 107 through a respective via 111. In FIG. 1C, each of the conductive lines 115 may include additional segments that are not illustrated. As will be discussed in more detail hereinafter with reference to FIGS. 2A, 2B, 3A, 3B and 4, the conductive bumps 121 form three or more polarity groups, which advantageously reduces the ESL of the semiconductor device 100. In addition, the shape of the conductive bumps 121, and ratio between the area of the via 119 and the area of the respective conductive bump 121, are designed to reduce the ESR of the semiconductor device.

FIG. 1D illustrates a plan view of the semiconductor device 100 along cross-section C-C in FIG. 1A, in accordance with another embodiment. For simplicity, not all features of the semiconductor device 100 are illustrated in FIG. 1D. In addition, to illustrate the relative location of various features, some features that are not in the cross-section C-C (e.g., 119, 115, 111, and 107) are illustrated in phantom.

In the example of FIG. 1D, the electrical components 103 are aligned along a line. The conductive line 107 may electrically couple together contact pads 102G (or 102P) from two adjacent electrical components 103. As illustrated in FIG. 1D, each of the conductive bumps 121 (e.g., 121P, 121G) is electrically coupled to a respective conductive line 115 through a respective via 119, and each of the conductive line 115 is electrically coupled to a respective conductive line 107 through a respective via 111. In FIG. 1D, each of the conductive lines 115 may include additional segments that are not illustrated. As will be discussed in more detail hereinafter, the conductive bumps 121 form three or more polarity groups, which advantageously reduce the ESL of the semiconductor device 100. In addition, the shape of the conductive bumps 121, and ratio between the area of the via 119 and the area of the respective conductive bump 121, are designed to reduce the ESR of the semiconductor device.

Variations to the example of FIGS. 1C and 1D are possible and are fully intended to be included within the scope of the present disclosure. For example, in FIG. 1D, a first row of electrical components 103 are illustrated. There may be a second row of electrical components 103 disposed in parallel with the first row of electrical components 103. The conductive lines 115 electrically coupled to respective electrical components 103 in the second row may re-route the locations of respective vias 119 and locations of respective conductive bumps 121, such that all of the vias 119 and conductive bumps 121 may be disposed in a similar pattern as illustrated in FIG. 2A.

Figure 2A:
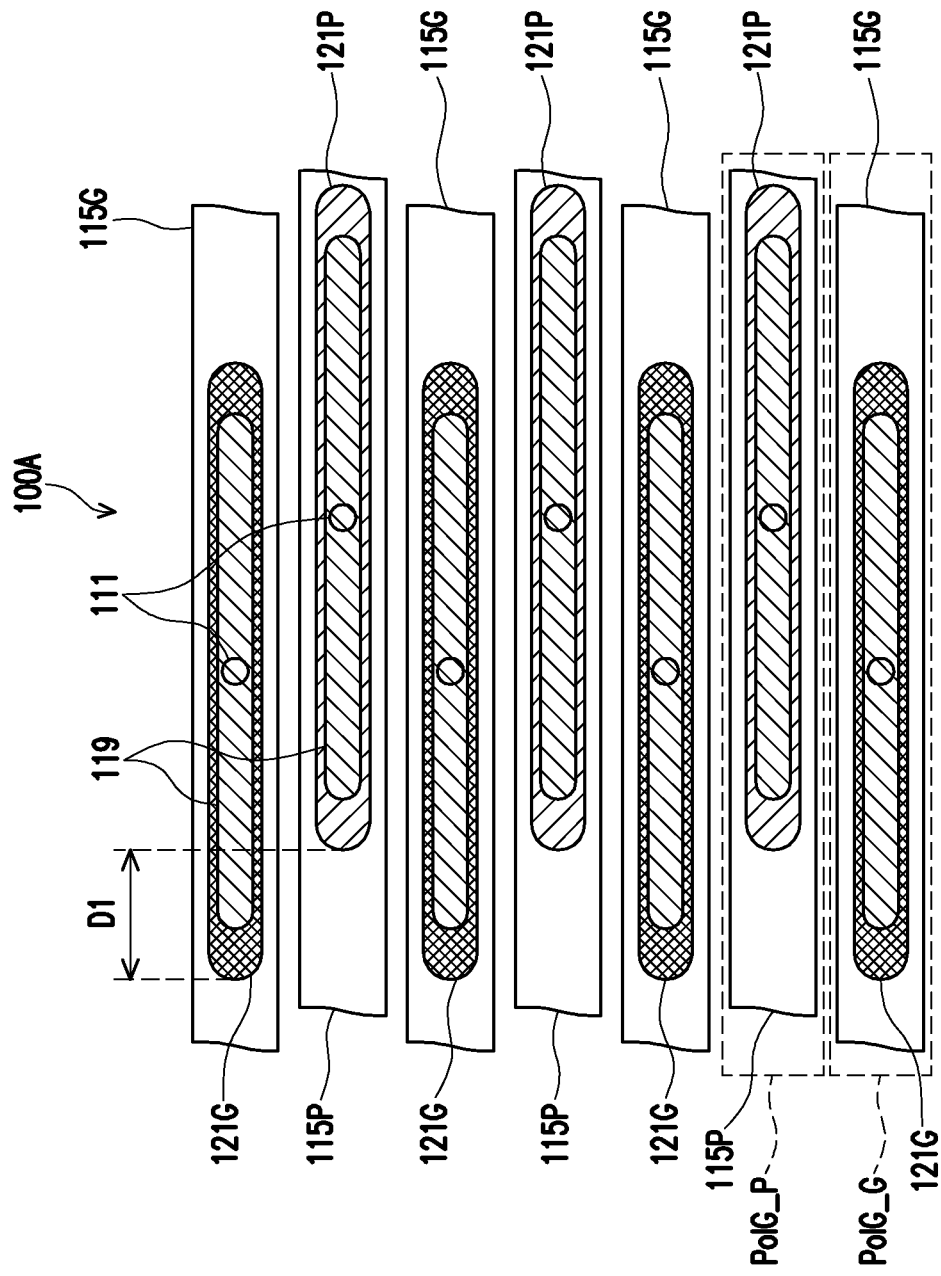
FIG. 2A illustrates a plan view of a semiconductor device, in an embodiment.
Figure 2B:
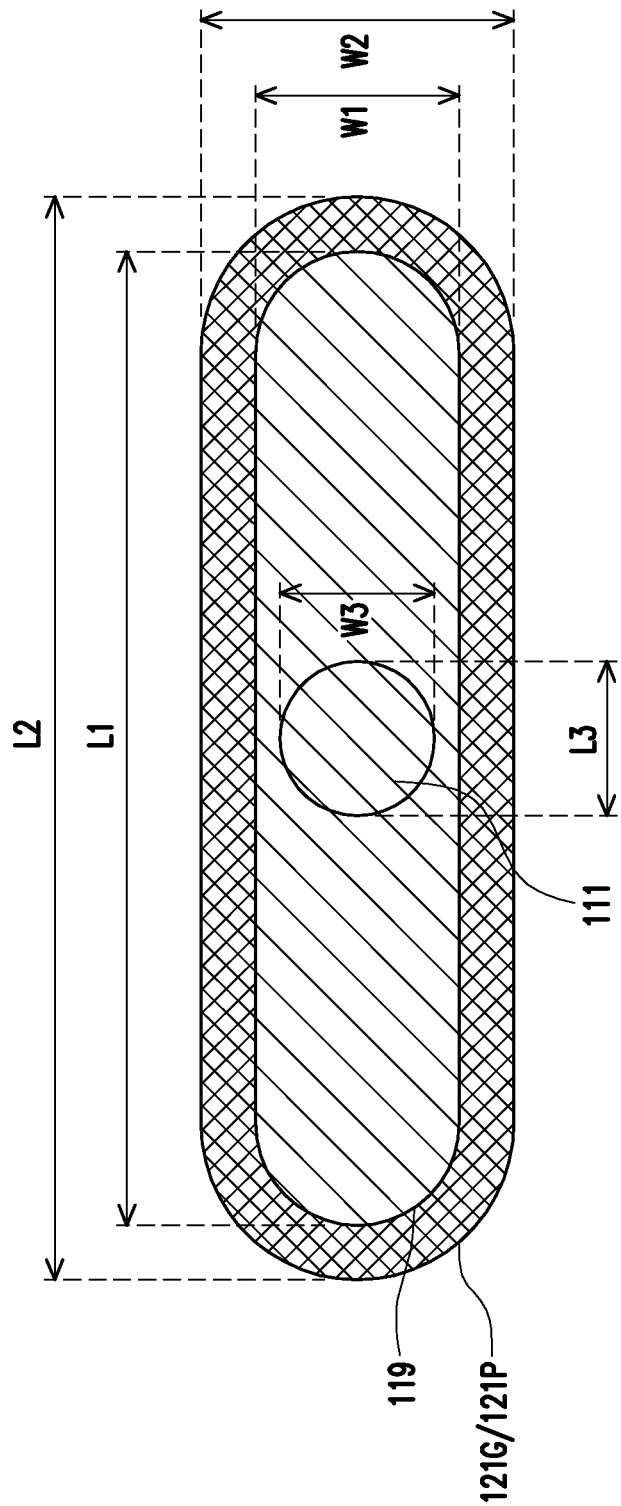
FIG. 2B illustrates a zoomed-in view of a portion of the semiconductor device of FIG. 2A.
Figure 4:
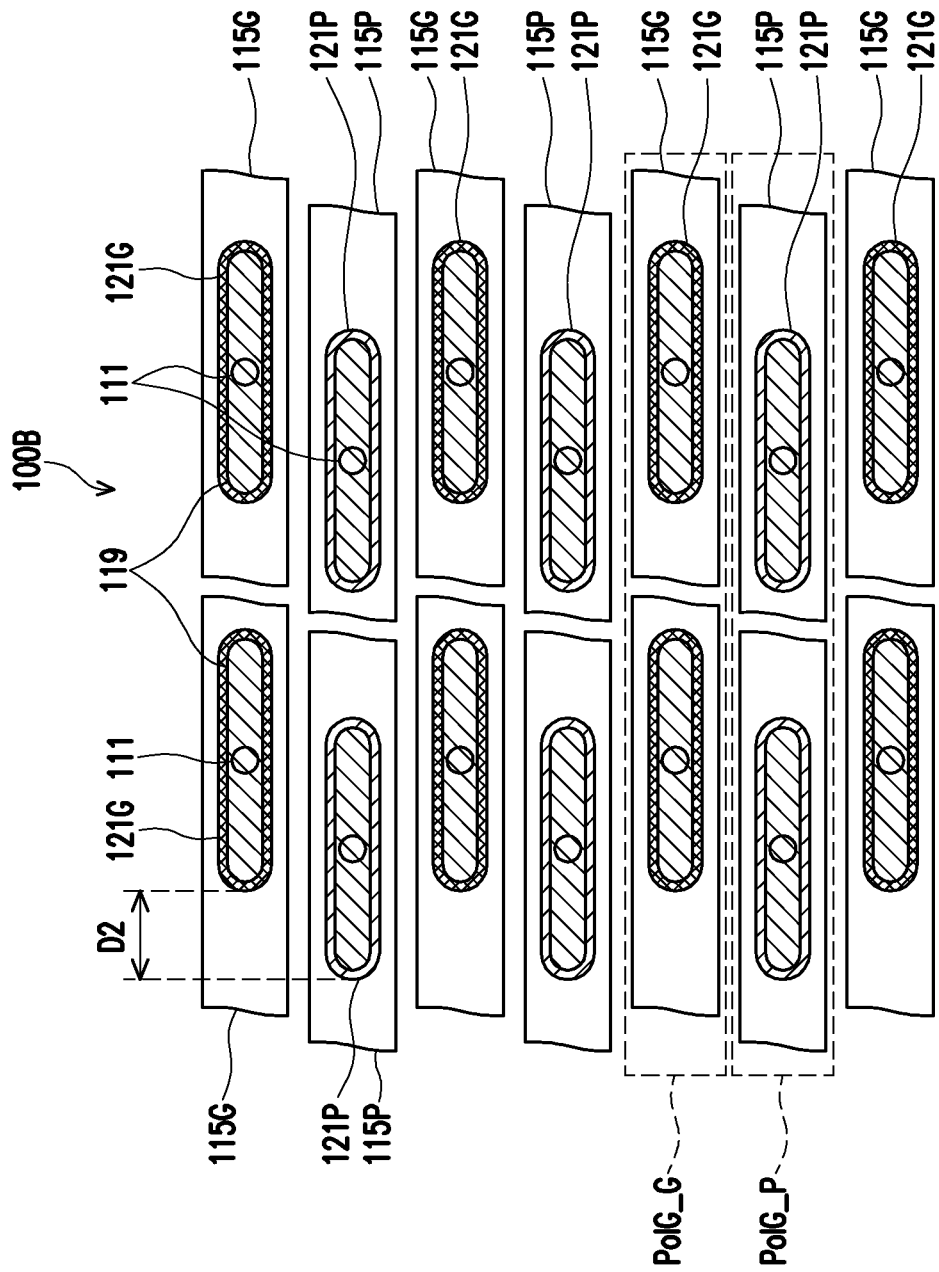
FIG. 4 illustrates a plan view of a semiconductor device, in accordance with an embodiment.

Discussion below with reference to FIGS. 2A, 2B and 4 are focused on the design of the conductive bumps 121 and certain features (e.g., vias 119, 111) of the interconnect structure 110 of the semiconductor device (e.g., 100A in FIGS. 2A and 2B, 100B in FIG. 4). Therefore, the electrical components 103 are omitted in FIGS. 2A, 2B and 4 to avoid clutter.

FIG. 2A illustrates a plan view of a semiconductor device 100A, in an embodiment. The plan view of the semiconductor device 100A in FIG. 2A is similar to the plan view of the semiconductor device 100 in FIG. 1D, but with different numbers of electrical components 103 and conductive bumps 121, among other things. Note that for clarity, not all features of the semiconductor device 100A are illustrated in FIG. 2A. In addition, to illustrate the relative positions of various features, some features (e.g., 119, 115, 111, and 103) that are not visible in the cross-section are also illustrated in FIG. 2A. FIG. 2B is a zoomed-in view showing a conductive bump 121 of FIG. 2A and certain conductive features (e.g., 119, 111) coupled to the conductive bump 121.

Referring now to FIG. 2A, FIG. 2A illustrates the conductive bumps 121 (e.g., 121G, 121P) and some conductive features of the interconnect structure 110 (see FIG. 1A) that are electrically coupled to the conductive bumps 121, such as vias 119, conductive lines 115, and vias 111. Note that in the illustrative example of FIG. 1A, the interconnect structure 110 has two via layers (e.g., 111, 119), two conductive line layers (e.g., 107, 115), and a layer of the conductive bumps 121, where the vias 119 are the topmost via layer of the interconnect structure 110, the conductive lines 115 are the topmost conductive line layer of the interconnect structure 110, and the vias 111 are the second topmost via layer of the interconnect structure 110. For embodiments where the interconnect structure 110 has more via layers and conductive line layers than what is illustrated in FIG. 1A, the vias 119 should be interpreted as the topmost via layer of the interconnect structure, the conductive lines 115 should be interpreted as the topmost conductive line layer of the interconnect structure, and the vias 111 should be interpreted as the second topmost via layer of the interconnect structure, in some embodiments.

In FIG. 2A, each of the conductive bumps 121 is disposed over a respective conductive line 115. The conductive bumps 121 may be disposed within the boundaries (e.g., sidewalls) of the respective conductive line 115. As illustrated in FIG. 2A, each of the conductive bumps 121 has an elongated shape. The conductive bumps 121 are illustrated to have a racetrack oval shape in FIG. 2A. This is merely a non-limiting example. Other suitable shapes, such as rectangle, oval, or the like, are also possible and are fully intended to be included within the scope of the present disclosure. In some embodiments, each of the conductive bumps 121 has a length $L_2$ (see FIG. 2B) and a width $W_2$ (see FIG. 2B), and a ratio between the length $L_2$ and the width $W_2$ is larger than about 3, such as between about 3 and about 100. The elongated shape of the conductive bump 121, together with the large ratio between the length $L_2$ and the width $W_2$, increase the area of the conductive bump 121 and help to reduce the ESR of the semiconductor device 100, as discussed in more details hereinafter.

FIG. 2A also illustrates the vias 119 of the interconnect structure 110. Each of the vias 119 is electrically coupled to a respective conductive bump 121. In the plan view of FIG. 2A (or FIG. 2B), each of the vias 119 has an area that is between about 20% to about 95%, such as between about 50% and about 90%, of an area of the conductive bump 121, in some embodiments. In some embodiments, the via 119 has a length $L_1$ (see FIG. 2B) and a width $W_1$ (see FIG. 2B), where $L_1$ is between about 50% and about 90% of $L_2$, and $W_1$ is between about 50% and about 90% of $W_2$. For example, in an embodiment design, the length $L_2$ is about 340 μm, the width $W_2$ is about 40 μm, the length $L_1$ is about 330 μm, and the width $W_1$ is about 30 μm. The elongated shape of the conductive bump 121 increases the area of the conductive bump 121, and since the via 119 has an area that is, e.g., 50% to 90% of the area of the conductive bump 121, the area of the via 119 is also increased compared with conventional designs. The large areas (e.g., cross-section areas) of the vias 119 advantageously reduce the ESR of the semiconductor device (e.g., 100, 100A, 100B) formed, thereby improving the efficiency (e.g., reduces power consumption) of the semiconductor device.

While a large area (e.g., larger than about 50% of the area of the conductive bump 121) of the via 119 helps to reduce the ESR, the area of the via 119 may not match (e.g., be 100% of) that of the conductive bump 121. The fabrication process may limit how close the area of the via 119 matches the area of the conductive bump 121, e.g., due to the error margin in the photolithography process used to form the opening for the conductive bump 121. If the area of the via 119 is close to 100% (e.g., larger than 95%) of the area of the conductive bump 121, there may not be enough error margin allowed for the photolithography process. In other words, an error (e.g., misalignment) in the photolithography process may result in defective conductive bumps 121 with poor electrical connections to be formed. Therefore, the above recited range (e.g., 50% to 90% of the area of the conductive bump 121) for the area of the vias 119 achieves good ESR reduction while preventing or reducing defective conductive bumps 121 from being formed.

In the illustrated embodiment of FIGS. 2A and 2B, the via 119 has a shape that is geometrically similar to the shape of the conductive bump 121. In other words, the shape of the via 119 may be a scaled (e.g., shrunk) version of the shape of the conductive bump 121. However, this is merely an example and not limiting. For example, the via 119 may have a shape that is different from the shape of the conductive bump 121, but still have an area that is between, e.g., about 50% and about 90% of the area of the conductive bump 121.

FIGS. 2A and 2B further illustrate the vias 111 coupled to respective vias 119 through conductive lines 115 (e.g., 115G, 115P, see also FIG. 1A). In the illustrated embodiment, the via 111 has an area that is smaller than the area of the via 119. For example, the area of the via 111 may be between about 10% and about 90% of the area of the respective via 119. As illustrated in FIG. 2B, the via 111 has a length $L_3$ and a width $W_3$, which are smaller than the length $L_1$ and the width $W_1$ of the via 119, respectively. In some embodiments, the length $L_3$ is between about 0.1 μm and about 10 μm, and the width $W_3$ is between about 0.1 μm and about 10 μm.

In some embodiments, the ESR of the semiconductor device 100 is reduced by increasing the areas (e.g., cross-section areas) of the topmost layer of vias (e.g., 119), but the areas (e.g., cross-section areas) of the lower layers of vias (e.g., 111) do not significantly affect the ESR. Therefore, the area of the vias 111 (and other lower layer of vias, if any) may be formed to be smaller than the area of the vias 119, which means that the vias 111 may be formed with a shorter processing time and less material (e.g., copper) than the via 119. Therefore, by forming the vias 119 to be larger (e.g., larger cross-section areas) than the vias 111, a good balance between lower ESR and lower processing time/material cost is achieved in the production of the semiconductor device.

In the example of FIGS. 2A and 2B, the via 111 has a different shape than the via 119. For example, the via 111 has a circular shape, and the via 119 has a racetrack oval shape. In other embodiments, the via 111 and the via 119 have similar shapes (e.g., geometrically similar shapes). In addition, although the via 111 is illustrated to have a circular shape, the via 111 may have other suitable shapes, such as square, rectangular, octagon, or the like.

Referring to FIG. 2A, the conductive bumps 121 are grouped into a plurality of polarity groups PolG (e.g., PolG_P, PolG_G), where each polarity group includes one or more conductive bumps 121 configured to be coupled to a same polarity of the power supply. For example, the polarity group PolG_P includes one or more conductive bumps 121P that are configured to be coupled to the voltage supply (e.g., +5V, +3V), and the polarity group PolG_G includes one or more conductive bumps 121G that are configured to be coupled to the reference voltage (e.g., electrical ground). The one or more conductive bumps 121 in a same polarity groups (e.g., PolG_P, or PolG_G) are disposed in a rectangular region along the upper surface of the semiconductor device 100A, in some embodiments. In FIG. 2A, two of the rectangular regions are illustrated by the dashed rectangular around the conductive bumps 121 and pointed to by the labels PolG_P and PolG_G. Other five rectangular regions, each around a respective conductive bump 121, are not labeled to avoid clutter.

In the illustrated embodiment, all of the conductive bumps 121 of a polarity group are configured to be coupled to the same polarity of the power supply. In other words, a polarity group should not include conductive bumps configured to be coupled to different polarities of the power supply. Polarity groups that are immediately adjacent to each other are configured to be coupled to different polarities of the power supply, and there is no stand-alone conductive bump (e.g., a conductive bump not belonging to a polarity group) between two immediately adjacent polarity groups, in some embodiments. A conductive bump 121 can only belong to a single polarity group, or stated in another way, no conductive bump 121 belongs to two different polarity groups. Therefore, there is no shared (e.g., common) conductive bump between different polarity groups, in some embodiments. In some embodiments, polarity groups do not intersect with each other. In some embodiments, the rectangular regions (e.g., see PolG_P and PolG_G in FIG. 2A) of two immediately adjacent polarity groups do not overlap.

In the example of FIG. 2A, there are seven polarity groups (only two polarity groups are labeled to avoid clutter) for the conductive bumps 121, where each polarity group includes one conductive bumps 121. In particular, there are three polarity groups PolG_P, each bordered by a rectangular region around a respective conductive bump 121P, and there are four polarity groups PolG_G, each bordered by a rectangular region around a respective conductive bump 121G. The number of polarity groups, and the number of conductive bumps in each polarity group as illustrated in FIG. 2A is merely an example and non-limiting. There may be more than one conductive bumps in a polarity group (see FIG. 4), and the number of polarity groups for the conductive bumps 121 may be three, four, or more. By having three or more polarity groups for the conductive bumps 121, ESL of the semiconductor device 100 is advantageously reduced, as discussed in details hereinafter.

Figure 5:
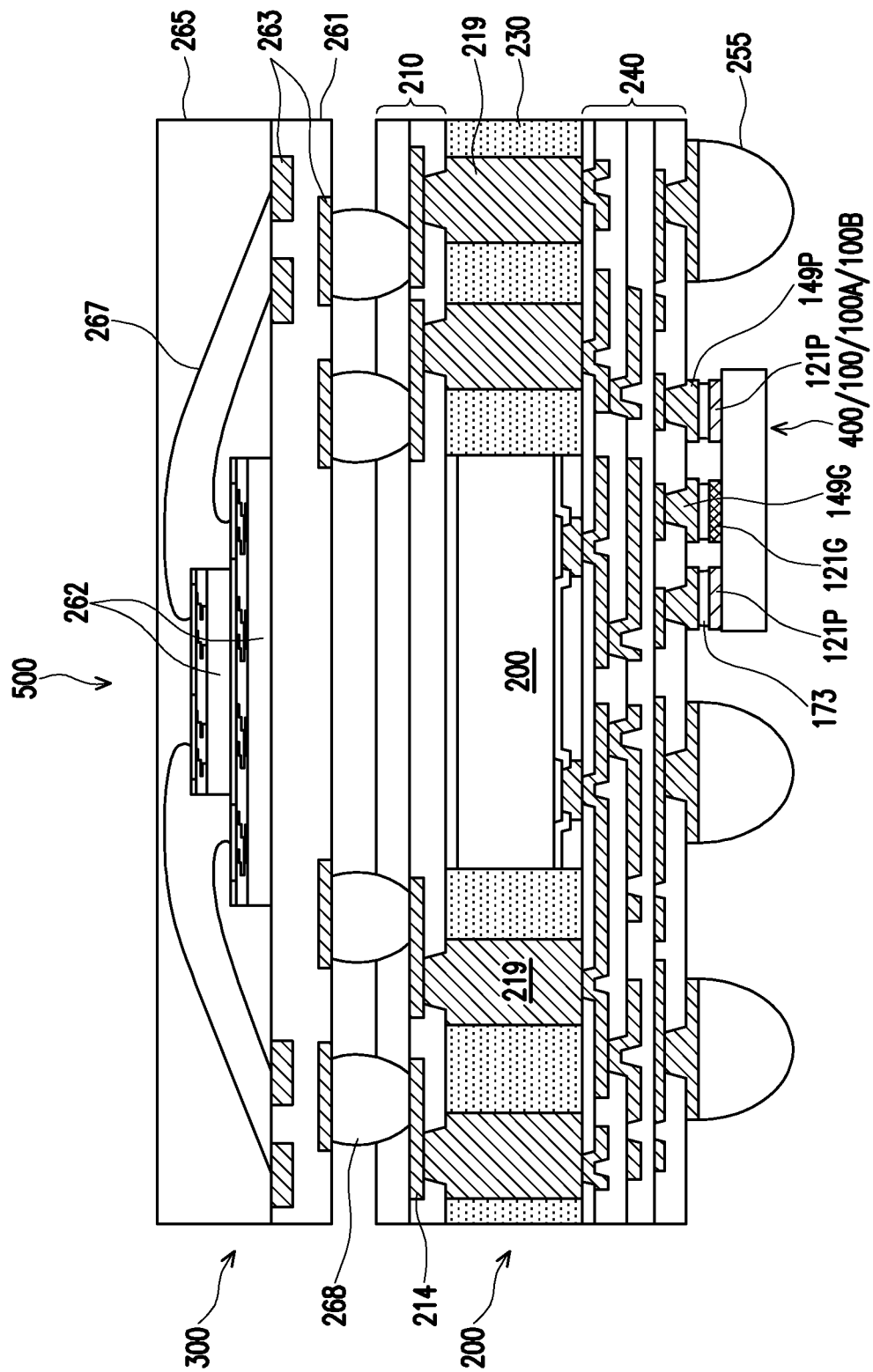
FIG. 5 illustrates a cross-sectional view of a semiconductor package, in accordance with some embodiments.

Still referring to FIG. 2A, the conductive bumps 121G are aligned with each other, and the conductive bumps 121P are aligned with each other. However, there is an offset $D_1$ between an end of a conductive bump 121G and an end of a conductive bump 121P. In other words, the conductive bumps 121G are staggered with the conductive bumps 121P with an offset $D_1$. In some embodiments, the offset $D_1$ is between about 5% and about 50%, such as between about 10% and about 20%, of the length $L_2$ (see FIG. 2B) of the conductive bump 121. The offset $D_1$ between the conductive bumps 121G and the conductive bumps 121P helps to reduce tilting (e.g., being non-level) of the semiconductor device (e.g., 100, 100A or 100B) when the semiconductor device is attached to another device or package (see, e.g., FIG. 5). Referring temporarily to FIG. 5, when a reflow process is performed to melt solder regions 123 (see label in FIG. 1A) for attaching the conductive bumps 121 of the semiconductor device 400/100/100A/100B to conductive features 149 (e.g., pads) of a bottom package 200, the melted solder on all of the conductive bumps 121 may flow unevenly to one side (e.g., all of the melted solder may flow to the left ends, or the right ends of conductive bumps 121, see FIG. 2A), if the conductive bumps 121P and 121G are all aligned. Therefore, due to the different amount of solder on different ends of the conductive bumps 121, the semiconductor device (e.g., 400/100/100A/100B) may be tilted (e.g., not parallel with) with respect to the bottom package 200, thus causing unreliable electrical connections between the two devices. In the current disclosure, by having the offset $D_1$ between the conductive bump 121G and the conductive bump 121P, the staggered distribution of the conductive bumps 121 reduces or prevents the possibility that the melted solder flow to a same ends of the conductive bumps 121, thereby reducing or preventing the tilting of the semiconductor device. In some embodiment, if the offset $D_1$ is smaller than about 5% of the length $L_2$, tilting of the semiconductor device may still happen; if the offset $D_1$ is larger than about 50% of the length $L_2$, the reduction in ESL may be negatively impacted (e.g., reduced). A large offset $D_1$ (e.g., >50%) may also limit the size of the IPD device formed. Various structures and methods for reducing or preventing the tilting of semiconductor device during the bonding process are disclosed in U.S. patent application Ser. No. 16/215,373, which application is hereby incorporated by reference in its entirety.

Figure 3A:
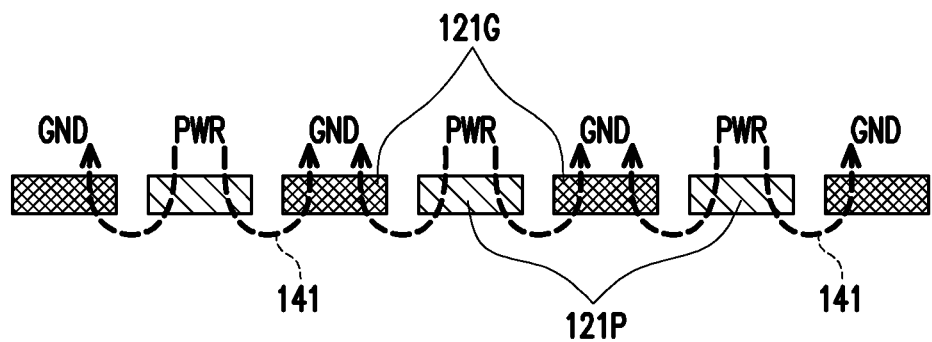
FIG. 3A illustrates multiple current paths of a semiconductor device, in accordance some embodiments.

FIG. 3A illustrates multiple current paths 141 of the semiconductor device (e.g., 100A and 100B) having seven polarity groups, in accordance some embodiments. Note that for simplicity, only the conductive bumps 121P and 121G are illustrated in FIG. 3A. More details of the current paths 141 (e.g., 141A, 141B) are illustrated in FIG. 1A. As illustrated in FIG. 3A, there are a total of six parallel current paths 141 between conductive bumps 121P and respective neighbor conductive bumps 121G. In some embodiments, there is a parasitic inductance between each pair of conductive bumps 121P and 121G, and therefore, the semiconductor device 100, by having seven polarity groups and six parallel current paths 141, has a parasitic inductance (e.g., ESL) that is equal to the equivalent inductance of six parallel connected parasitic inductors.

Figure 3B:
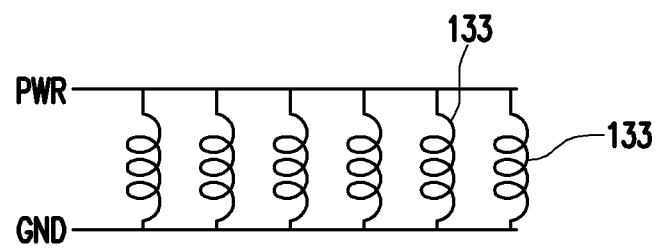
FIG. 3B illustrates a schematic view of six inductors connected in parallel.

FIG. 3B illustrates a schematic view of six inductors 133 connected in parallel. One skilled in the art will appreciate that the equivalent inductance of a plurality of parallel connected inductors is smaller than the inductance of each of the plurality of parallel connected inductors. For example, assuming that each of the inductors 133 has a same inductance denoted as L, then the equivalent inductance of the six parallel connected inductors 133 is L/6. Therefore, by having three or more polarity groups for the conductive bumps 121 (therefore two or more parallel current paths 141), the ESL of the semiconductor device 100 is reduced (e.g., by more than half) compared with a conventional two-terminal design (e.g., comprising only two polarity groups) for conductive bumps.

FIG. 4 illustrates a plan view of another semiconductor device 100B similar to the semiconductor device 100A of FIG. 2A, in accordance with an embodiment. There are seven polarity groups for the conductive bumps 121 in FIG. 4, and only two are labeled to avoid clutter. The polarity groups in FIG. 4 are similar to those in FIG. 2A, but with more conductive bumps 121 in each polarity group. In particular, in FIG. 4, each polarity group (e.g., PolG_G, or PolG_P) of the conductive bumps 121 includes two conductive bumps 121 (e.g., two conductive bumps 121G, or two conductive bumps 121P). In FIG. 4, each conductive bumps 121 is electrically coupled to a respective via 119, a respective conductive line 115, and a respective via 111. The discussion above regarding the shape and size of the conductive bumps 121 with respect to the vias 119, and the shape and size of the via 119 with respect to the via 111, applies to the embodiment of FIG. 4. For example, a ratio between a length and a width of each of the conductive bump 121 in FIG. 4 is larger than about 3, such as between about 3 and about 100. The area of each via 119 is between about 20% to about 95%, such as between about 50% and about 90%, of the area of a respective conductive bump 121 to which the via 119 is coupled, in some embodiments. The area of the via 111 is smaller than the area of the via 119, and the via 111 may have a different shape from the via 119, in some embodiments. As illustrated in FIG. 4, there is an offset $D_2$ between an end of a conductive bump 121G and an end of conductive bump 121G, where $D_2$ may be between about 10% and about 20% of the length of the conductive bump 121. In an embodiment, the length and the width of the conductive bump 121 in FIG. 4 is about 140 μm and about 40 μm, respectively, and the length and the width of the via 119 in FIG. 4 is about 130 μm and about 30 μm, respectively.

Embodiments disclosed herein achieve significant performance improvement over designs without the disclosed features. Simulations were performed to study the ESL and ESR of the semiconductor device 100A of FIG. 2A, and the semiconductor device 100B of FIG. 4. For comparison, a reference two-terminal device having a power pad (e.g., configured to be connected to a supply voltage such as +5V) and a ground pad (e.g., configured to be connected to a reference voltage such as electrical ground) is also simulated. The simulation results show that compared with the reference two-terminal device, both the semiconductor devices 100A and 100B achieve about 98% reduction in the ESL at 100 MHz frequency, and achieve about 94% reduction in the ESR at 100 MHz frequency.

In addition, the ESL and ESR of a second reference device were also simulated for comparison. Conductive bumps of the second reference device has seven polarity groups, where each polarity group includes a plurality of circular shaped micro-bumps (e.g., having a 1:1 aspect ratio), and each micro-bump is coupled to an underlying conductive line (e.g., in an interconnect structure) through a via that has a smaller area (e.g., cross-section) than the micro-bump. The simulation results show that compared with the second reference device, the semiconductor devices 100A and 100B achieve about 20% reduction and about 10% reduction, respectively, in the ESL at 100 MHz frequency, and achieve about 33% reduction and about 23% reduction, respectively, in the ESR at 100 MHz frequency.

FIG. 5 illustrates a cross-sectional view of a semiconductor package 500, in accordance with some embodiments. The semiconductor package 500 includes a bottom package 200, a top package 300, and a semiconductor device 400 (e.g., an IPD) attached to the bottom package 200. The semiconductor device 400 may be the semiconductor device 100, 100A, or 100B disclosed above.

In FIG. 5, the semiconductor device 400, which may be any of the above disclosed semiconductor devices (e.g., 100, 100A, or 100B), is attached to the bottom package 200. The bottom package 200 has a die 220 between a front side redistribution structure 240 and a backside redistribution structure 210. Each of the front side redistribution structure 240 and the backside redistribution structure 210 includes conductive features (e.g., conductive lines and vias) formed in one or more dielectric layers. A molding material 230 is formed between the front side redistribution structure 240 and the backside redistribution structure 210. Conductive pillars 219, such as copper pillars, are formed in the molding material 230. The conductive pillars 219 electrically couple the front side redistribution structure 240 with the backside redistribution structure 210.

Still referring to FIG. 5, a top package 300 is bonded to the bottom package 200 through conductive joints 268. As illustrated in FIG. 5, the top package 300 has a substrate 261 and one or more semiconductor dies 262 (e.g., memory dies) attached to an upper surface of the substrate 261. In some embodiments, the substrate 261 includes silicon, gallium arsenide, silicon on insulator ("SOI") or other similar materials. In some embodiments, the substrate 261 is a multiple-layer circuit board. In some embodiments, the substrate 261 includes bismaleimide triazine (BT) resin, FR-4 (a composite material composed of woven fiberglass cloth with an epoxy resin binder that is flame resistant), ceramic, glass, plastic, tape, film, or other supporting materials. The substrate 261 may include conductive features (e.g., conductive lines and vias) formed in/on the substrate 261. As illustrated in FIG. 5, the substrate 261 has conductive pads 263 formed on an upper surface and a lower surface of the substrate 261, which conductive pads 263 are electrically coupled to the conductive features of the substrate 261. The one or more semiconductor dies 262 are electrically coupled to the conductive pads 263 by, e.g., bonding wires 267. A molding material 265, which may comprise an epoxy, an organic polymer, a polymer, or the like, is formed over the substrate 261 and around the semiconductor dies 262. In some embodiments, the molding material 265 is conterminous with the substrate 261, as illustrated in FIG. 5.

In some embodiments, a reflow process is performed to electrically and mechanically coupled the top package 300 to the backside redistribution structure 210. Conductive joints 268 are formed between the conductive pads 263 and conductive features 214 of the backside redistribution structure 210. In some embodiments, the conductive joints 268 comprise solder regions, conductive pillars (e.g., copper pillars with solder regions on at least end surfaces of the copper pillars), or any other suitable conductive joints. Similarly, a reflow process may be performed to bond the conductive bumps 121 of the semiconductor device 400 to conductive features 149 (e.g., conductive pads) of the bottom package 200. In some embodiments, the shapes, the sizes, and the locations of the conductive features 149 match (e.g., are equal to) those of the respective conductive bumps 121. Solder regions 173 may be formed between the conductive features 149 and the conductive bumps 121. In some embodiments, the conductive bumps 121P are bonded to conductive features 149P, which conductive features 149P are electrically coupled to a supply voltage (e.g., +5V, +3V) of a power supply, e.g., through external connectors 255 of the bottom package 200. Similarly, the conductive bumps 121G are bonded to conductive features 149G, which conductive features 149G are electrically coupled to a reference voltage (e.g., electrical ground) of the power supply through, e.g., the external connectors 255.

Variations to the disclosed embodiments are possible and are fully intended to be included within the scope of the present disclosure. For example, the number of polarity groups and the number of conductive bumps within a polarity group may be changed to other suitable numbers. The shape or the size of the conductive bumps 121, and the shape or the size of the vias 119 may be modified to have other suitable shapes/values without departing from the spirit of the present disclosure. As another example, the passive device (e.g., capacitor) integrated in the semiconductor device may have two terminals that are interchangeable (e.g., polarity may be switched), and therefore, the illustrations and discussions above regarding conductive features (e.g., 121P, or 121G) configured to be coupled to a specific polarity may be switched (e.g., 121P/115P switched 121G/115G, 121G/115G switched to 121P/115G) to form other embodiments of the present disclosure.

Figure 6:
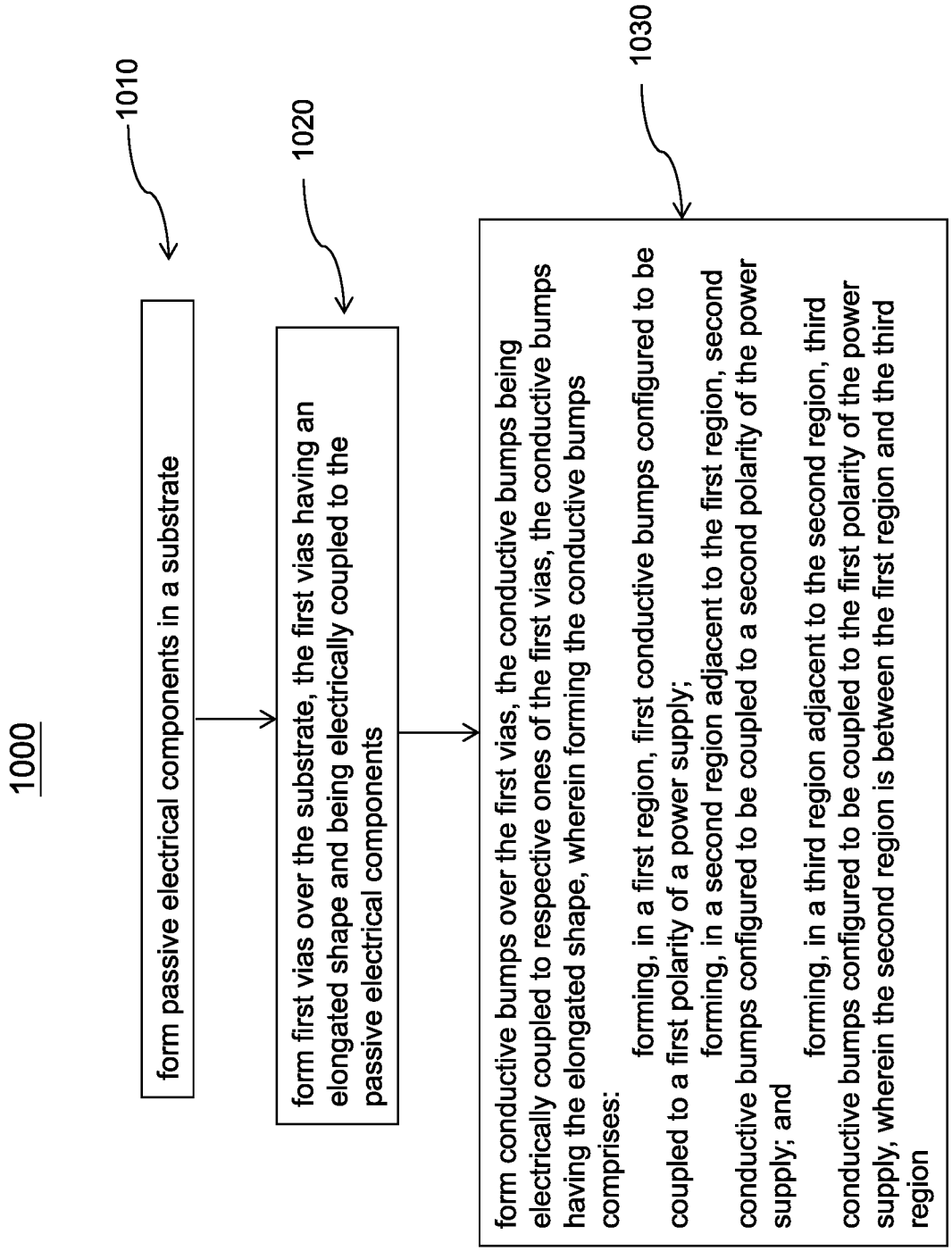
FIG. 6 illustrates a flow chart of a method for forming a semiconductor device, in accordance with some embodiments.

FIG. 6 illustrates a flow chart of a method for forming a semiconductor device, in accordance with some embodiments. It should be understood that the embodiment method shown in FIG. 6 is merely an example of many possible embodiment methods. One of ordinary skill in the art would recognize many variations, alternatives, and modifications. For example, various steps as illustrated in FIG. 6 may be added, removed, replaced, rearranged and repeated.

Referring to FIG. 6, in block 1010, passive electrical components are formed in a substrate. In block 1020, first vias are formed over the substrate, the first vias having an elongated shape and being electrically coupled to the passive electrical components. In block 1030, conductive bumps are formed over the first vias, the conductive bumps being electrically coupled to respective ones of the first vias, the conductive bumps having the elongated shape, wherein forming the conductive bumps comprises forming, in a first region, first conductive bumps configured to be coupled to a first polarity of a power supply; forming, in a second region adjacent to the first region, second conductive bumps configured to be coupled to a second polarity of the power supply; and forming, in a third region adjacent to the second region, third conductive bumps configured to be coupled to the first polarity of the power supply, wherein the second region is between the first region and the third region.

Embodiment may achieve advantages. By having three or more polarity groups in the conductive bumps 121, ESL of the semiconductor device formed is reduced. By forming vias 119 having large cross-section areas (e.g., 50% to 90% of the area of the conductive bumps 121), ESR of the semiconductor device formed is also reduced. The disclosed embodiments improve the performance of the semiconductor devices formed by allowing for higher operating frequency and by lowering power consumption. For forming the via 119 to be larger than the via 111, a good balance between lowering ESR and lower process time/cost is achieved.

In an embodiment, a semiconductor device includes passive electrical components in a substrate; and an interconnect structure over the passive electrical components, conductive features of the interconnect structure being electrically coupled to the passive electrical components. The conductive features of the interconnect structure includes a first conductive line over the substrate; a conductive bump over the first conductive line, where in a plan view, the conductive bumps has a first elongated shape and is entirely disposed within boundaries of the first conductive line; and a first via between the first conductive line and the conductive bump, the first via electrically connected to the first conductive line and the conductive bump, where in the plan view, the first via has a second elongated shape and is entirely disposed within boundaries of the conductive bump. In an embodiment, the interconnect structure includes a plurality of conductive bumps, where the interconnect structure includes a plurality of electrically conductive paths, where each of the electrically conductive paths couples one of the conductive bumps to at least one contact pad of one of the passive electrical components, where the interconnect structure is free of a conductive feature that provides electrical connection among the plurality of electrically conductive paths. In an embodiment, the passive electrical components are of a same type, where the passive electrical components are capacitors, resistors, or inductors. In an embodiment, in the plan view, the first via has an area that is between about 50% and about 90% of an area of the conductive bump. In an embodiment, the interconnect structure includes a second via between the first conductive line and the substrate, the second via electrically coupled to the first via, where in the plan view, an area of the second via is smaller than an area of the first via. In an embodiment, the second elongated shape is geometrically similar to the first elongated shape.

In an embodiment, a semiconductor device includes a substrate; electrical components in the substrate; and metallization layers over and electrically coupled to the electrical components, where the metallization layers includes first vias and conductive bumps over the first vias, the conductive bumps electrically coupled to the first vias, where the first vias are in a topmost via layer of the metallization layers, where the conductive bumps includes a first group of bumps configured to be coupled to a first polarity of a power supply; a second group of bumps configured to be coupled to a second polarity of the power supply; and a third group of bumps configured to be coupled to the first polarity of the power supply, where the second group of bumps is between the first group of bumps and the third group of bumps. In an embodiment, the first group of bumps are disposed in a first region, the second group of bumps are disposed in a second region, and the third group of bumps are disposed in a third region, where there is no conductive bump between the first region and the second region, where there is no conductive bump between the second region and the third region. In an embodiment, the electrical components are capacitors, resistors, or inductors. In an embodiment, in a plan view, each of the conductive bumps has an elongated shape. In an embodiment, the elongated shape has a length and a width, a ratio between the length and the width being larger than about 3. In an embodiment, a first conductive bump of the conductive bumps is electrically connected to a first via of the first vias, where in a plan view, an area of the first via is between about 50% and about 90% of an area of the first conductive bump. In an embodiment, in the plan view, the first via has a similar geometric shape as the first conductive bump. In an embodiment, the metallization layers include a plurality of conductive paths, where each of the conductive paths includes conductive lines and vias of the metallization layers that are coupled between a conductive bump and a contact pad of an electrical component, where there is no conductive feature in the metallization layers connecting conductive paths that are coupled to different conductive bumps. In an embodiment, the metallization layers includes a layer of second vias between the first vias and the substrate, where the second vias are electrically coupled to respective first vias, where in a plan view, each of the first vias has an area larger than an area of a respective one of the second vias. In an embodiment, each of the first vias has a shape different from a shape of the respective one of the second vias.

In an embodiment, a method includes forming passive electrical components in a substrate; forming first vias over the substrate, the first vias having an elongated shape and being electrically coupled to the passive electrical components; and forming conductive bumps over the first vias, the conductive bumps being electrically coupled to respective ones of the first vias, the conductive bumps having the elongated shape, where forming the conductive bumps includes forming, in a first region, first conductive bumps configured to be coupled to a first polarity of a power supply; forming, in a second region adjacent to the first region, second conductive bumps configured to be coupled to a second polarity of the power supply; and forming, in a third region adjacent to the second region, third conductive bumps configured to be coupled to the first polarity of the power supply, where the second region is between the first region and the third region. In an embodiment, in a top view, each of the first vias has a first area that is between about 50% and about 90% of a second area of a respective conductive bump. In an embodiment, the method further includes forming second vias between the first vias and the substrate, where each of the second vias is electrically coupled to a respective first via, where in the top view, each of the second vias has a third area smaller than the first area of the respective first via. In an embodiment, a shape of the first vias is different from a shape of the second vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a substrate;
electrical components in the substrate; and
metallization layers over and electrically coupled to the electrical components, wherein the metallization layers comprise first vias and conductive bumps over the first vias, the conductive bumps electrically coupled to the first vias, wherein the first vias are in a topmost via layer of the metallization layers, wherein the conductive bumps comprise:
a first group of bumps configured to be coupled to a first polarity of a power supply;
a second group of bumps configured to be coupled to a second polarity of the power supply; and
a third group of bumps configured to be coupled to the first polarity of the power supply, wherein the second group of bumps is between the first group of bumps and the third group of bumps.

2. The semiconductor device of claim 1, wherein the first group of bumps are disposed in a first region, the second group of bumps are disposed in a second region, and the third group of bumps are disposed in a third region, wherein there is no conductive bump between the first region and the second region, wherein there is no conductive bump between the second region and the third region.

3. The semiconductor device of claim 1, wherein the electrical components are capacitors, resistors, or inductors.

4. The semiconductor device of claim 1, wherein in a plan view, each of the conductive bumps has an elongated shape.

5. The semiconductor device of claim 4, wherein the elongated shape has a length and a width, a ratio between the length and the width being larger than about 3.

6. The semiconductor device of claim 1, wherein a first conductive bump of the conductive bumps is electrically connected to a first via of the first vias, wherein in a plan view, an area of the first via is between about 5% and about 90% of an area of the first conductive bump.

7. The semiconductor device of claim 6, wherein in the plan view, the first via and the first conductive bump have geometrically similar shapes.

8. The semiconductor device of claim 1, wherein the metallization layers comprise a plurality of conductive paths, wherein each of the conductive paths comprises conductive lines and vias of the metallization layers that are coupled between a conductive bump and a contact pad of an electrical component, wherein there is no conductive feature in the metallization layers connecting conductive paths that are coupled to different conductive bumps.

9. The semiconductor device of claim 1, wherein the metallization layers comprise a layer of second vias between the first vias and the substrate, wherein the second vias are electrically coupled to respective first vias, wherein in a plan view, each of the first vias has an area larger than an area of a respective one of the second vias.

10. The semiconductor device of claim 9, wherein each of the first vias has a shape different from a shape of the respective one of the second vias.

11. A semiconductor device comprising:
a substrate;
electrical components in the substrate; and
metallization layers over and electrically coupled to the electrical components, wherein the metallization layers comprise:
first vias in a topmost via layer of the metallization layers;
conductive bumps over and electrically coupled to respective ones of the first vias, wherein the conductive bumps comprise:
a first bump configured to be coupled to a first polarity of a power supply;
a second bump configured to be coupled to a second polarity of the power supply; and
a third bump configured to be coupled to the first polarity of the power supply, wherein the second bump is between the first bump and the third bump.

12. The semiconductor device of claim 11, wherein the first bump is immediately adjacent to the second bump, and the second bump is immediately adjacent to the third bump.

13. The semiconductor device of claim 12, wherein in a plan view, the first bump and the third bump are aligned such that first ends of the first bump and second ends of the third bump define a rectangular area, and the second bump is misaligned with the first bump such that at least one end of the second bump is outside the rectangular area.

14. The semiconductor device of claim 13, wherein in the plan view, there is an offset along a longitudinal direction of the first bump between an end of the first bump and a respective end of the second bump, wherein the offset is between about 5% and about 50% of a length of the first bump.

15. The semiconductor device of claim 11, wherein in a plan view, each of the conductive bumps has a first elongated shape, and each of the first vias has a second elongated shape, wherein the second elongated shape is geometrically similar to the first elongated shape.

16. The semiconductor device of claim 15, wherein an area of the second elongated shape is between about 50% and about 90% of an area of the first elongated shape.

17. The semiconductor device of claim 16, wherein the metallization layers further comprises:
   metal lines under and electrically coupled to the first vias; and
   second vias under the metal lines and electrically coupled to respective ones of the first vias, wherein in the plan view, each of the first vias has a first area, and each of the second vias has a second area smaller than the first area.

18. The semiconductor device of claim 17, wherein the second vias and the first vias have different shapes.

19. A semiconductor device comprising:
   a substrate;
   electrical components in the substrate;
   first vias over the substrate and electrically coupled to the electrical components, wherein each of the first vias has a first shape;
   conductive lines over and electrically coupled to the first vias;
   second vias over and electrically coupled to respective ones of the first vias through the conductive lines, wherein each of the second vias has a second shape;
   conductive bumps over and electrically coupled to respective ones of the first vias, wherein the conductive bumps comprise:
      a first bump configured to be coupled to a first polarity of a power supply;
      a second bump configured to be coupled to a second polarity of the power supply; and
      a third bump configured to be coupled to the first polarity of the power supply, wherein the second bump is between the first bump and the third bump, wherein the first bump, the second bump, and the third bump have a third shape, wherein the third shape is geometrically similar to the second shape and is larger than the second shape.

20. The semiconductor device of claim 19, wherein the first shape is different from the second shape and is smaller than the second shape.

* * * * *

UNITED STATES PATENT AND TRADEMARK OFFICE
CERTIFICATE OF CORRECTION

PATENT NO. : 10,861,841 B2
APPLICATION NO. : 16/215325
DATED : December 8, 2020
INVENTOR(S) : Ying-Cheng Tseng et al.

It is certified that error appears in the above-identified patent and that said Letters Patent is hereby corrected as shown below:

In the Claims

In Column 16, Line 18, Claim 6, delete "5%" and insert --50%--.

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*